United States Patent [19]

Smith

[11] 4,037,308

[45] July 26, 1977

[54] METHODS FOR MAKING TRANSISTOR STRUCTURES

[75] Inventor: George Elwood Smith, Murray Hill, N.J.

[73] Assignee: Bell Telephone Laboratories, Incorporated, Murray Hill, N.J.

[21] Appl. No.: 738,533

[22] Filed: Nov. 3, 1976

Related U.S. Application Data

[60] Division of Ser. No. 560,590, March 21, 1975, abandoned, which is a continuation-in-part of Ser. No. 485,962, July 5, 1974, abandoned.

[51] Int. Cl.$^2$ .............................................. B01J 17/00
[52] U.S. Cl. ........................................ 29/571; 29/591;
357/23
[58] Field of Search ................... 29/571, 578, 591;
357/23

[56] References Cited

U.S. PATENT DOCUMENTS

| | | | |
|---|---|---|---|
| 3,514,844 | 6/1970 | Bower | 29/571 |
| 3,699,646 | 10/1972 | Vadasz | 29/571 |

OTHER PUBLICATIONS

Neus Aus der Technik, Feb. 1972, vol. 1, pp. 1 & 2, "Preparation of Semiconductor Components with Narrow Semiconducting Regions, etc.".

*Primary Examiner*—W. Tupman
*Attorney, Agent, or Firm*—Irwin Ostroff

[57] ABSTRACT

In one embodiment, an extremely short channel FET is made by forming a metal layer over a wafer, depositing silicon dioxide over part of the metal layer, oxidizing the exposed metal, controllably etching a portion of the silicon dioxide to expose a small strip of the nonoxidized metal layer, electroplating the exposed metal strip, thereby to form an extremely narrow gate electrode, removing the deposited SiO$_2$, the metal oxide and the remaining metal layer to leave only the gate electrode, and using the gate electrode as a mask for ion implanting source and drain regions. Since the gate electrode can be made so narrow, the channel region is correspondingly short to give extremely high frequency capabilities. Other embodiments are also described.

3 Claims, 3 Drawing Figures

METHODS FOR MAKING TRANSISTOR STRUCTURES

CROSS-REFERENCE TO RELATED APPLICATION

This application is a division of the copending application Ser. No. 560,590 filed Mar. 21, 1975 and assigned to Bell Telephone Laboratories, Incorporated, now abandoned, which is a continuation-in-part of Ser. No. 485,962 filed July 5, 1974, assigned to Bell Telephone Laboratories, Incorporated, and now abandoned.

BACKGROUND OF THE INVENTION

This invention relates to methods for making transistor structures, and more particularly, to methods for making transistors having impurity regions separated by extremely small lateral distances.

Because of its ease of fabrication, the field effect transistor (FET) is finding widespread use in integrated circuit technology. The most common FET is one using source and drain regions on the surface of a silicon wafer separated by a channel region through which current is controlled by a gate electrode overlying the channel region and insulated from it by a thin layer of silicon dioxide. These devices lend themselves to large scale integrated circuit fabrication techniques because all of the source and drain regions can be made by simultaneous impurity diffusions or implantations, and relatively large packing densities can be achieved. One drawback is that their electronic speed of operation is limited by the difficulty of making a short channel over which a gate electrode can be accurately registered.

A device that is structurally related to the FET is the lateral bipolar transistor in which emitter and collector regions on the surface of a wafer are separated by a short base region. The applicability of these devices are limited by the difficulty in making a sufficiently short base region on the surface of the wafer.

SUMMARY OF THE INVENTION

I have found that short channel FETs, and bipolar transistors having short base regions, can be made by using an edge of a semiconductor mask as a reference location for defining an extremely short lateral distance. Various techniques will be described by which the edge of a first mask is used to determine a first impurity region, and as a reference location for a second mask, the second mask having a second edge a short lateral distance from the first impurity region. This second edge is then used to define a second impurity region removed a short lateral distance from the first impurity region. The closely spaced impurity regions define a short channel region of an FET or a short base region in a lateral bipolar transistor.

A specific embodiment for implementing this principle is succinctly described in the Abstract of the Disclosure and will not be repeated. A significant consequence of that particular technique is that the gate electrode is inherently accurately registered over the extremely short channel region. Another consequence is that the device is susceptible to mass production and to large scale integrated circuit techniques so that arrays of high speed FETs can be made on a single semiconductor chip.

Other embodiments, objects, features and advantages of the invention will be better understood from a consideration of the following description taken in conjunction with the accompanying drawing.

DRAWING DESCRIPTION

FIGS. 1 through 3 illustrate an embodiment of the invention.

DETAILED DESCRIPTION

Figure 1:
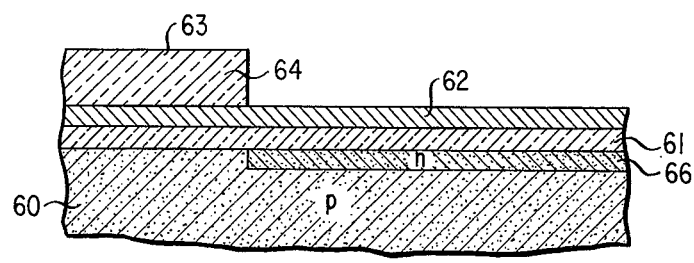
Figure 2:
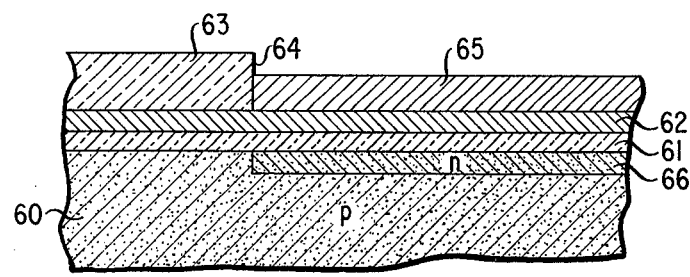
Figure 3:
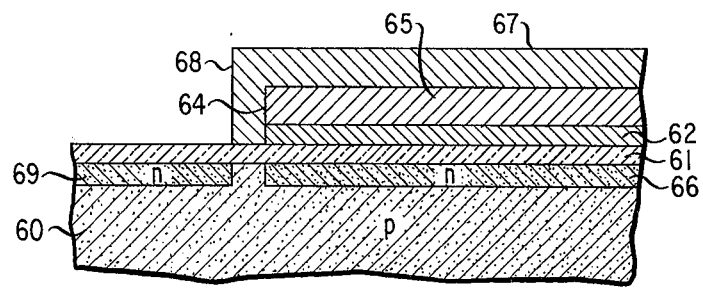

Referring to FIGS. 1 through 3, a method of making a lateral bipolar transistor in a wafer 60 is illustrated. First a thin oxide layer 61 and a thin metal layer 62 are formed. Next, a thick layer of deposited silicon dioxide 63 having a mask edge 64 is deposited. An ion implantation step using layer 63 as a mask forms an n-type collector region 66. Thereafter, another layer of metal 65 is deposited, as by electroplating, only on the exposed surface of metal layer 62.

Referring to FIG. 3, since layer 65 abutted against silicon dioxide layer 63 it has an edge 64. The silicon dioxide layer 63 and exposed metal layer 62 are selectively dissolved so that the only exposed metal is layer 65. Next, another metal layer 67 is selectively formed on metal layer 65, as by electroplating or by an electroless process. Metal deposited by electrochemical plating forms a layer of uniform thickness, and thus, the edge 68 of layer 67 is displaced a small predictable distance from edge 64. The emitter region 69 is then formed by ion implantation using edge 68 to define its lateral extent. The thickness of metal layer 67 of course defines the distance between emitter 69 and collector 66, and again, this distance may be made very small and with great accuracy. Layer 62 is preferably a very thin layer of tungsten. Layer 65 is preferably electroplated nickel and layer 67 is preferably nickel plated by electroless deposition. Tungsten may be selectively etched by a solution comprising 0.1 molar potassium ferricyanide ($K_3FeCN_6$), 0.25 molar $KH_2PO_4$ and 0.23 molar KOH.

The foregoing embodiments are to be considered as merely illustrative of the inventive concepts. The various materials and their corresponding etchants are illustrative of various such materials, as are the conductivities and implant processes. Diffusion could be used in certain instances rather than ion implantation and it may be used in conjunction with ion implantation. Various other embodiments and modifications may be made by those skilled in the art without departing from the spirit and scope of the invention.

What is claimed is:

1. A method for making transistors comprising:
   the steps of forming over a semiconductor substrate a first mask having an exposed portion which includes a first vertical edge;
   forming a first impurity region in the substrate at a location defined by the first vertical edge of the first mask;
   forming a second mask which has a first vertical edge which abuts the first vertical edge of the first mask;
   controllably increasing the lateral extent of the second mask to cause the first vertical edge thereof to be extended by a controllable amount to define a second vertical edge; and
   forming a second impurity region in the substrate at a location defined by the second vertical edge of the second mask.

2. The method of claim 1 wherein:
   the first mask is silicon dioxide (e.g., 63) which is used as a ion implantation mask to define the location of the first impurity region (e.g., 66); and the second edge (68) is part of a metal layer used as an ion implantation mask to define the location of the second impurity region (e.g., 69).

3. A method for making a transistor comprising the steps of:

forming over a semiconductor substrate a thin oxide layer (e.g., 61);

forming over the oxide layer a first thin metal layer (e.g., 62);

forming on part of the thin metal layer a first mask having a first edge (e.g., 64);

ion implanting a first impurity region (e.g., 66) in the substrate using the first mask as an ion implant mask;

depositing a second metal layer (e.g., 65) on the first metal layer such that it abuts against the first edge;

removing the first mask and that portion of the first metal layer not covered by the second metal layer;

electrochemically plating a third metal layer (e.g., 67) over the exposed surface of the first and second metal layers, whereby the third metal layer has a second edge (e.g., 68) laterally removed from the location of the first edge by a distance substantially equal to the thickness of the third metal layer; and ion implanting a second impurity region (e.g., 69) using the third metal layer as an ion implant mask.

* * * * *